(12) United States Patent
Naem

(10) Patent No.: US 6,709,936 B1
(45) Date of Patent: Mar. 23, 2004

(54) NARROW HIGH PERFORMANCE MOSFET DEVICE DESIGN

(75) Inventor: Abdalla Naem, Overiise (BE)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/458,450

(22) Filed: Jun. 10, 2003

Related U.S. Application Data

(62) Division of application No. 10/054,282, filed on Nov. 13, 2001, now Pat. No. 6,597,043.

(51) Int. Cl.[7] .................. H01L 21/336; H01L 21/76; H01L 31/112; H01L 29/76
(52) U.S. Cl. .................. 438/297; 438/424; 438/156; 257/286; 257/327; 257/387
(58) Field of Search .................. 257/346, 365, 257/387, 388, 401, 412, 413, 286; 438/149–151, 163, 164, 194, 217, 225, 289, 294–297, 353, 400–430, 282, 156

(56) References Cited

U.S. PATENT DOCUMENTS

| | | | | |
|---|---|---|---|---|
| 5,315,143 | A | | 5/1994 | Tsuji .......................... 257/351 |
| 5,331,192 | A | * | 7/1994 | Kudoh ........................ 257/368 |
| 6,031,246 | A | | 2/2000 | Hamada et al. ................ 257/48 |
| 6,281,547 | B1 | | 8/2001 | So et al. ...................... 257/330 |
| 6,297,530 | B1 | | 10/2001 | Akatsu et al. ............... 257/327 |
| 6,316,805 | B1 | | 11/2001 | Lin et al. ..................... 257/328 |
| 6,316,808 | B1 | | 11/2001 | Smith, III .................... 257/339 |
| 6,396,108 | B1 | | 5/2002 | Krivokapic et al. ......... 257/365 |
| 6,407,416 | B2 | | 6/2002 | Mori ........................... 257/219 |
| 6,597,026 | B2 | * | 7/2003 | Ogura ......................... 257/287 |

FOREIGN PATENT DOCUMENTS

| | | | | |
|---|---|---|---|---|
| DE | 3308115 A1 | | 9/1984 | .......... H01L/27/12 |
| JP | 5-235339 | * | 9/1993 | .......... H01L/29/78 |

OTHER PUBLICATIONS

A.A. Naem et al., Compensation Tendency of Short–Channel and Narrow–Channel Effects in Small–Geometry IGFETs, *Electronics Letters*, Feb. 4th, 1982, vol. 18, No. 3, pp. 135–136.

H.S. Lee, "An Analysis of the Threshold Voltage for Short–Channel IGFET's," *Solid–State Electronics*, 1973, vol. 16, pp. 1407–1417.

* cited by examiner

*Primary Examiner*—Caridad Everhart
*Assistant Examiner*—Calvin Lee
(74) *Attorney, Agent, or Firm*—Stallman & Pollock LLP

(57) ABSTRACT

The present invention provides a narrow/short high performance MOS device structure that includes a rectangular-shaped semiconductor substrate region having a first conductivity type. A region of dielectric material is formed at the center of the substrate region. Four substrate diffusion regions, each having a second conductivity type opposite the first conductivity type, are formed in the substrate diffusion region in a respective corner of the substrate region. The four diffusion regions are spaced-apart such that a substrate channel region is defined between each adjacent pair of substrate diffusion regions. A common conductive gate electrode is formed to have four fingers, each one of the fingers extending over a corresponding substrate channel region. The fingers of the common conductive gate electrode are spaced-apart from the underlying substrate channel regions by dielectric material formed therebetween.

2 Claims, 2 Drawing Sheets

NARROW HIGH PERFORMANCE MOSFET DEVICE DESIGN

This application is a division of U.S. application Ser. No. 10/054,282, filed Nov. 13, 2001 and issued as U.S. Pat. No. 6,597,043.

BACKGROUND OF THE INVENTION

1. Field of the Invention

The present invention relates to semiconductor integrated circuit structures and, in particular, to a novel MOSFET gate design that includes narrow and short gate cells that are connected both in parallel and in series in order to increase the device current derive, while maintaining the overall device performance characteristics of larger geometry devices, and while minimizing short channel effects (SCE) and narrow channel effects (NCE).

2. Discussion of the Related Art

It has been shown that MOSFET transistors show degraded performance due to enhanced short channel effects (SCE) as the transistors are made shorter while maintaining large channel width. For example, the threshold voltage of an N-channel MOSFET transistor gets smaller as the channel length of the transistor is made shorter. In general, the overall performance characteristics of a MOSFET device become impaired as a result of severe short channel effects if the device is made shorter than that provided by currently available technology.

The channel width of a MOSFET device has a similar effect on the transistor characteristics, but in the opposite sense. That is, the threshold voltage of an N-channel MOSFET transistor becomes larger when the channel width is made narrower.

H. S. Lee, "An Analysis of the Threshold Voltage for Short Channel IGFETs", Solid State Electronics, 1973, vol. 15, pgs. 1407–1417, teaches that when the MOSFET transistor channel gate is made short as well as narrow, the two threshold voltage shift effects, i.e. SCE and NCE, have a compensating tendency. Also, the threshold voltage of such a short/narrow device can actually improve and may approach that of a larger geometry device.

SUMMARY OF THE INVENTION

The present invention provides a novel MOSFET gate design. The new gate design includes short/narrow gate cells that are connected in parallel and in series in order to increase the device current derive. The overall device performance characteristics would look like those of a larger geometry device, with minimal short channel effects and narrow channel effects.

One embodiment of the present invention provides a narrow high performance MOS device structure that includes a rectangular-shaped semiconductor substrate well region having a first conductivity type. The well region is surrounded by shallow trench isolation (STI). A region of STI dielectric material is also formed at the center of the substrate region. Four substrate diffusion regions, each having a second conductivity type opposite the first conductivity type, are formed in the substrate diffusion region in a respective corner of the substrate well region. The four diffusion regions are spaced-apart such that a substrate channel region is defined between each adjacent pair of substrate diffusion regions. A common conductive gate electrode is formed to have four fingers, each one of the fingers extending over a corresponding substrate channel region. The fingers of the common conductive gate electrode are spaced-apart from the underlying substrate channel regions by dielectric material formed therebetween.

Further features and advantages of the present invention will become apparent from the following detailed description and accompanying drawings that set forth an illustrated embodiment in which the principals of the invention are utilized.

DETAILED DESCRIPTION

Figure 1:
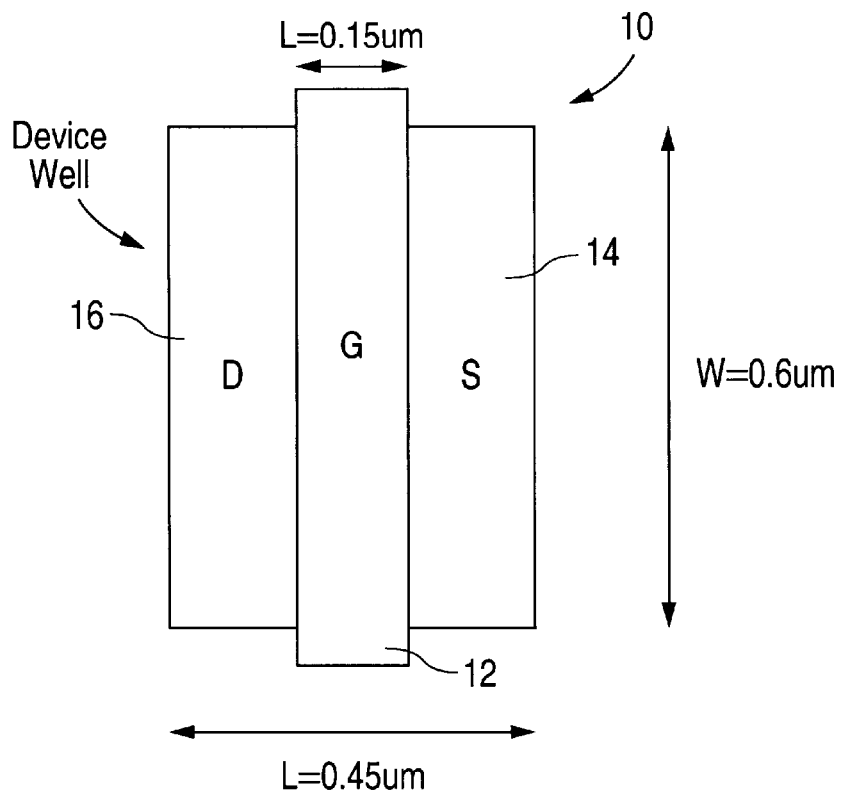
FIG. 1 is a plan view illustrating a conventional MOSFET device design

FIG. 1 shows a conventional MOSFET device design structure 10 that includes a gate electrode 12 and a device well that includes a source region 14 and a drain region 16. The device well is surrounded by shallow trench isolation (STI) in the conventional manner. Those skilled in the art will appreciate that a substrate channel region underlies the gate electrode 12 and that gate dielectric material separates the gate 12 from the substrate channel region. The conventional device 10 illustrated in FIG. 1 has a channel width/Length ratio w/L=0.6/0.15=4. The total device well area in the FIG. 1 design is 0.6×0.45 um=0.27 um2.

Figure 2A:
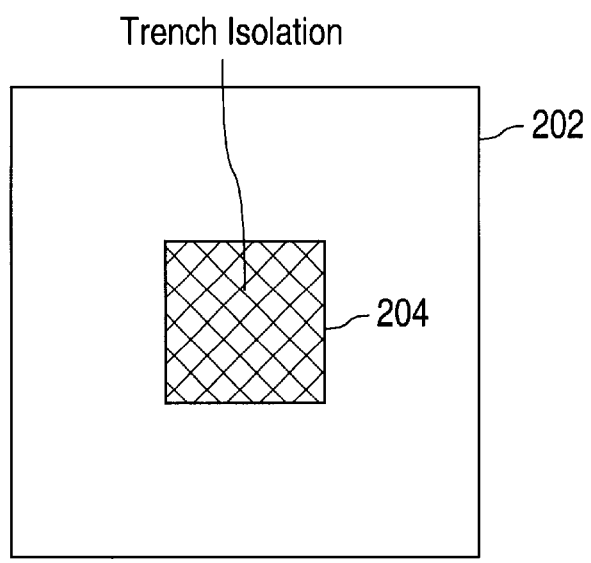
FIG. 2A is a plan view illustrating device well formation for a MOSFET device design in accordance with the present invention.

FIG. 2A shows a rectangular-shaped device well having an island of oxide trench isolation formed in the middle of the device well.

Figure 2B:
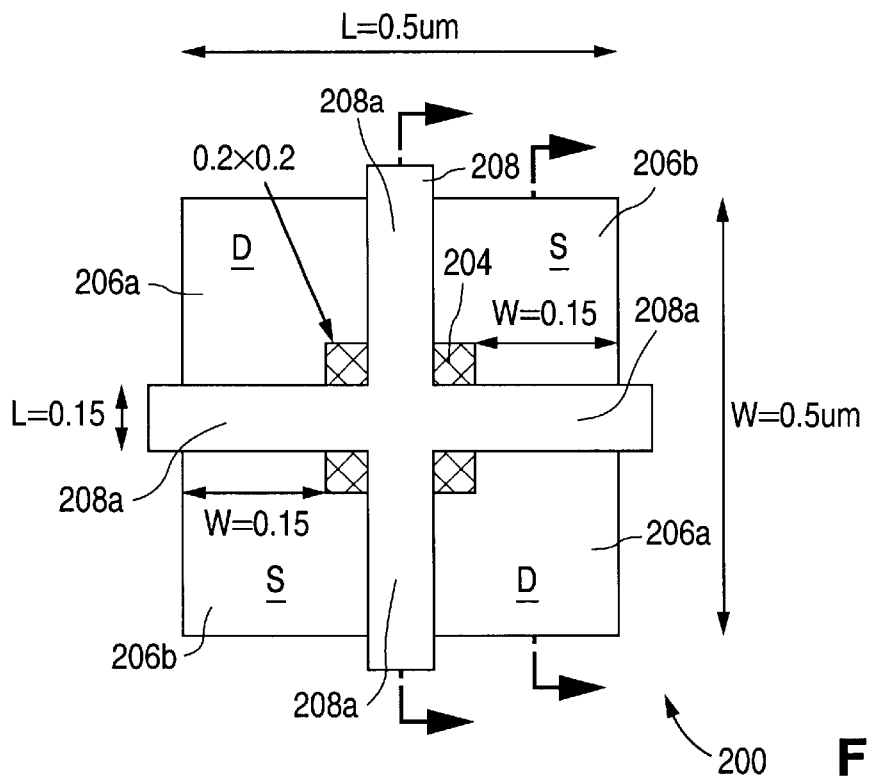
FIG. 2B is a plan view illustrating a MOSFET device design in accordance with the present invention.

FIG. 2B shows a narrow MOSFET device structure 200 in accordance with the present invention. The MOSFET device 200 has the same current derive as the conventional device design 10 shown in FIG. 1. The total device well for the FIG. 2B design is 0.5×0.5=0.25 um2.

Figure 2C:
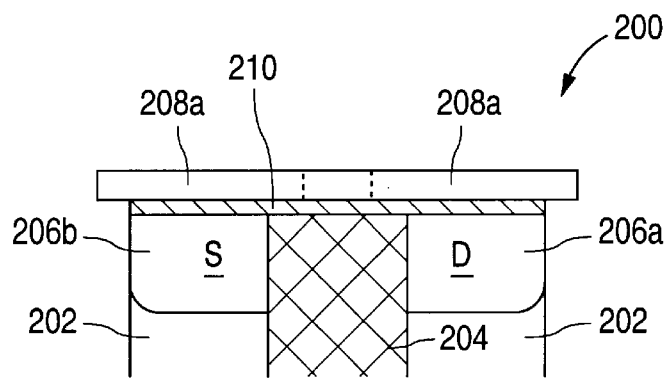
FIG. 2C is a partial cross-section view taken along line 2C—2C in FIG. 2B.

FIG. 2C shows a cross-section of the FIG. 2B device structure 200 taken along line 2C—2C in FIG. 2B.

Figure 2D:
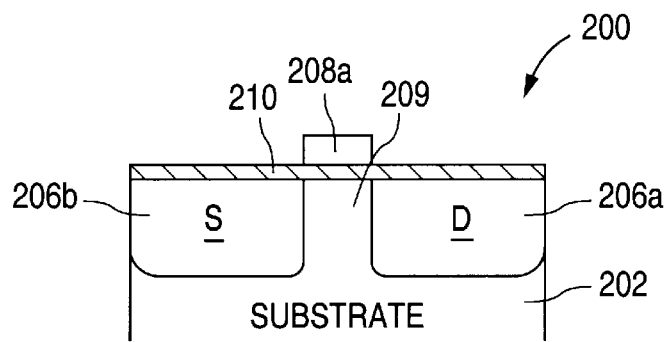
FIG. 2D is a partial cross-sectional view taken along line 2D—2D in FIG. 2B.

FIG. 2D shows a cross-section of the FIG. 2B device structure 200 taken along line 2D—2D in FIG. 2B.

Referring to FIGS. 2A–2D, a narrow high performance transistor structure 200 in accordance with the present invention is formed in a rectangular-shaped device well 202 of semiconductor substrate material, typically silicon, having a first conductivity type. A region of shallow trench isolation (STI) dielectric material 204, typically silicon dioxide, is formed at the center of the device well region 202. Four substrate diffusion regions, having a second conductivity type opposite the first conductivity type, are formed in respective comers of the substrate device well region 202. The diffusion regions are spaced-apart to define a substrate channel region 209 between each adjacent pair of diffusion regions. Diagonally opposite pairs of diffusion regions are connected to drain and source contacts to provide the drain regions 206a and source regions 206b, respectively, of the MOSFET transistor structure. A common conductive gate electrode 208, typically polysilicon, has four gate electrode fingers 208a. Each gate electrode finger 208a extends over a corresponding substrate channel region 209 and is spaced-apart therefrom by gate dielectric material 210, typically silicon dioxide.

Thus, the present invention provides a narrow/short high performance MOSFET device design that, in comparison with conventional device designs, has a smaller device well area, provides similar or higher current derive, reduces both short channel effects and narrow channel effects in the overall device performance, and saves additional expensive processing steps which would be required to minimize short channel effects or narrow channel effects separately in conventional device designs.

Those skilled in the art will appreciate that the structure of the narrow/short high performance MOSFET device design provided by the present invention can be fabricated utilizing conventional integrated circuit manufacturing techniques. For example, the fabrication process could proceed as follows: First, shallow trench isolation (STI) oxide is formed in the silicon substrate to device a substrate device well 202 having the first conductivity type; an STI region 204 is simultaneously formed at the center of the well region. A layer of gate oxide is then formed over the well region 202 and a layer of polysilicon is formed over the gate oxide. A patterned photoresist mask is then formed over the poly layer and utilized to etch the poly layer to define the conductive gate electrode 208. The poly etch can be designed to stop on the gate oxide to protect the underlying well region, or optionally, as shown in FIGS. 2A–2D, be designed to etch through the gate oxide as well. Following the poly etch step, the gate electrode structure is utilized in a self-aligned ion implantation step to define the source and drain regions of the MOSFET device; the poly gate electrode is simultaneously doped to the desire conductivity level. Although these conventional fabrication steps, considered individually, are not considered to be part of the invention, the process module resulting in the novel device structure of the present invention is considered to be within the scope of the present invention.

It should be understood that various alternatives to the embodiments of the invention described above can be employed in practicing the invention. It is intended that the following claims define the scope of the invention and that methods and structures within the scope of these claims and their equivalents be covered thereby.

What is claimed is:

1. A method of forming a high performance MOSFET transistor structure, the method comprising:

forming a region of dielectric material in a center region of a rectangular-shaped semiconductor substrate region having a first conductivity type;

forming a layer of gate dielectric material over the semiconductor substrate region;

forming a layer of conductive material over the layer of gate dielectric material;

patterning the layer of conductive material to define a common conductive gate electrode having first, second, third and fourth fingers, each finger extending over a corresponding channel region of the semiconductor substrate region and separated from the semiconductor substrate region by intervening gate dielectric material; and forming first, second, third and fourth diffusion regions having a second conductivity type, each diffusion region being formed at a respective corner of the semiconductor substrate region such that a channel region is defined between each adjacent pair of diffusion regions.

2. A method of forming a high performance MOSFET transistor structure, the method comprising:

forming shallow trench isolation silicon oxide in a silicon substrate to define an isolated rectangular silicon device region in the silicon substrate and simultaneously forming a region of silicon oxide in the silicon device region at a center region of the silicon device region;

forming a layer of gate silicon oxide over the silicon device region;

forming a layer of polysilicon over the layer of gate silicon oxide;

patterning the layer of polysilicon to define a common polysilicon gate electrode of the MOSFET transistor structure, the gate electrode having first, second, third and fourth fingers, each finger extending outwardly from a common gate electrode central region formed over the central silicon oxide region, each finger extending over a corresponding channel region of the MOSFET transistor structure and separated therefrom by intervening gate silicon oxide;

forming first, second, third and fourth dopant diffusion regions having a second conductivity type opposite the first conductivity type, each dopant diffusion region being formed at a respective corner of the silicon device region such that a channel region is defined between each adjacent pair of dopant diffusion region;

forming a first electrical contact to the first and third dopant diffusion regions to define source regions of the MOSFET transistor structure; and forming a second electrical contact to the second and fourth dopant diffusion regions to define drain regions of the MOSFET transistor structure.

\* \* \* \* \*

UNITED STATES PATENT AND TRADEMARK OFFICE
CERTIFICATE OF CORRECTION

PATENT NO. : 6,709,936 B1
DATED : March 23, 2004
INVENTOR(S) : Abdalla Naem

It is certified that error appears in the above-identified patent and that said Letters Patent is hereby corrected as shown below:

<u>Title page,</u>
Item [75], Inventor, please correct inventor's residence as follows:
-- Overijse (BE) --.

Signed and Sealed this

Eighteenth Day of May, 2004

JON W. DUDAS
*Acting Director of the United States Patent and Trademark Office*